US006866889B1

(12) United States Patent
Lill et al.

(10) Patent No.: US 6,866,889 B1
(45) Date of Patent: Mar. 15, 2005

(54) METHOD AND MEANS FOR DRILL PRODUCTION

(75) Inventors: Richard Mark Lill, Beighton (GB); John Dick, Consett (GB); Alan Stevenson, Newcastle Upon Tyne (GB)

(73) Assignee: Dormer Tools (Sheffield) Limited, Sheffield (GB)

( * ) Notice: Subject to any disclaimer, the term of this patent is extended or adjusted under 35 U.S.C. 154(b) by 399 days.

(21) Appl. No.: 10/030,906

(22) PCT Filed: Jul. 14, 2000

(86) PCT No.: PCT/GB00/02713

§ 371 (c)(1),
(2), (4) Date: Jan. 14, 2002

(87) PCT Pub. No.: WO01/04375

PCT Pub. Date: Jan. 18, 2001

(30) Foreign Application Priority Data

Jul. 14, 1999 (GB) .............................. 9916558

(51) Int. Cl.$^7$ .............................................. C23C 16/04
(52) U.S. Cl. ............................... 427/248.1; 427/255.5; 118/728; 118/729; 118/730; 269/16; 269/292; 269/302; 269/303
(58) Field of Search ................................ 118/728, 729, 118/730; 269/16, 292, 302, 303; 427/248.1, 255.5

(56) References Cited

U.S. PATENT DOCUMENTS

| 4,528,208 A | * | 7/1985 | Hirvonen et al. ........... 427/526 |
| 5,961,798 A | * | 10/1999 | Robinson et al. ...... 204/298.25 |

FOREIGN PATENT DOCUMENTS

EP 470-447 A1 * 2/1992

* cited by examiner

*Primary Examiner*—Timothy Meeks
(74) *Attorney, Agent, or Firm*—Stites & Harbison PLLC; Douglas E. Jackson

(57) ABSTRACT

A holder (2; 22; 82) for coating drill with a ceramic coating by a vapor deposition process has a perforated outer wall (4; 24; 84) into which the drills are inserted with their tips projecting. The holder has a hollow interior in which support means locate the inserted drills parallel and with their tips projecting to the same extent. The support means may comprise a correspondingly perforated inner wall (8; 26; 86) and a back wall (10; 28; 88) against which the drills abut, the outer, inner and back walls being parallel to each other. In one configuration, the holder has a hexagonal plan form with alternate outer walls (4) perforated and each with associated inner and back walls (8, 10). The holder is provided with a lid (52) that shields the interior from ingress of the coating material but provides an air passage to assist cooling of the portions of the drills in the holder interior after the coating has been applied.

8 Claims, 4 Drawing Sheets

METHOD AND MEANS FOR DRILL PRODUCTION

Figure 1:
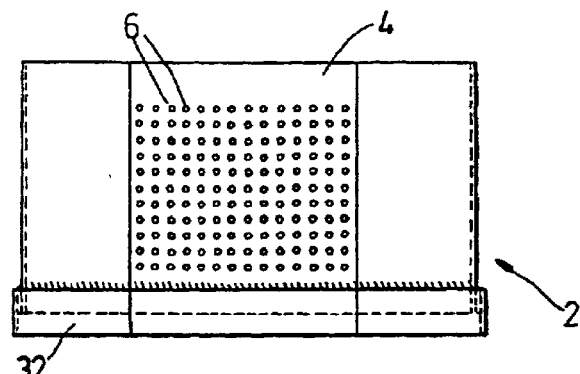

This invention relates to the production of drills and in particular to the application of coatings, such as ceramic coatings, to drills.

It is known to coat the point and flutes of a fluted high speed steel drill with a ceramic such as titanium nitride or aluminium titanium nitride to improve wear or cutting performance. The application of such coatings adds considerably to the cost of the drill, however.

It would be possible to lower the cost by limiting the coating to the drill point and the region immediately behind the point, but the cost of the coating material although significant, is only one factor of the total cost. Ceramic coatings are typically applied by physical vapour deposition (PVD) in a vacuum chamber, by such processes as evaporative arc or electron beam or sputtering, and the considerable cost of operating such equipment is a major factor, but there is little difference in process time with the length of the drill being coated.

The present invention aims to provide an improved method and means by which a coating can be applied to drills, in particular to apply a coating to a limited portion at and near the drill tip to provide a wider commercial application for coated drills. According to one aspect of the invention, a hollow holder is provided for supporting a series of drills in a vapour deposition chamber to allow a ceramic coating to be deposited on tip regions of the drills, the holder having at least one perforated outer wall provided with an array of apertures into which the drills can be inserted with said tip regions projecting outwards from the holder, within the holder there being provided supports for the inserted drills in the or each said wall for locating the drills with their shanks substantially parallel and stop means for locating the tips of drills of the same diameter projecting to the substantially same extent from said outer wall.

The stop means can be formed by a back wall in the interior of the holder, parallel to said outer wall. An inner wall can be arranged between the outer and back walls and parallel to both, with a corresponding array of apertures to that in the outer wall to hold the drills with their shanks parallel.

Typically, the active zone of a PVD chamber is close to its inside wall. To assist even application of the coating, it is known to rotate the articles to be coated to vary continuously the exposure of the surfaces to the vapour. Thus, by using a turntable the articles can be circulated along the periphery of the rotary path. It is also known to mount articles to be coated on planetary carriers rotating on axes parallel to the turntable axis, so that the articles are given a double rotation.

To aid the efficient use of such a planetary motion system, according to another aspect of the invention a hollow holder is provided for supporting a series of drills in a vapour deposition chamber to allow a ceramic coating to be deposited on tip regions of the drills, the holder having a hexagonal plan form comprising alternate perforated outer walls provided with an array of apertures into which the drills can be inserted with said tip regions projecting outwards, said holder providing supports for the inserted drills in each said wall to locate the drills with their shanks substantially parallel and with the tips of drills of the same diameter projecting to substantially the same extent from each outer wall.

A perforated inner wall can be arranged in the holder, parallel to each outer wall and provided with a corresponding array of apertures, and a back wall can be arranged behind and parallel to each such pair of perforated walls, against which the rear of the drills can abut to set their depth of insertion.

The walls of the hollow holders according to the invention may be relatively thin to keep the thermal mass of the holders low, giving quicker heating and cooling at the beginning and end of the vapour deposition cycle, so as to reduce the cycle time. It is known to admit an inert gas into the chamber at the end of the cycle to increase the rate of cooling and preferably the holders are so arranged that the gas is allowed to circulate through the hollow interior of the holders also. However, the shanks of the drills must be shielded from the deposition material if they are not also to be coated, so the tops of the holders must be closed.

In accordance with a preferred feature of the invention, the holder is provided with a lid that shields the hollow interior from above, said lid being provided with a passage for facilitating the venting and cooling of said interior after application of the PVD coating.

According to another aspect of the invention there is provided a method of vapour-deposition coating the tips of a series of drills in which the drills are inserted in a hollow holder having a polygonal plan form with the tips to be coated projecting from at least one outer face of said polygonal form, the holder with the inserted tips being rotated in a vapour deposition chamber to allow each of the drill tips to project from the holder towards the periphery of the chamber for at least a part of the processing period, and a gas being allowed to circulate through the holder interior after deposition of the coating to assist cooling of the drills.

Figure 2:
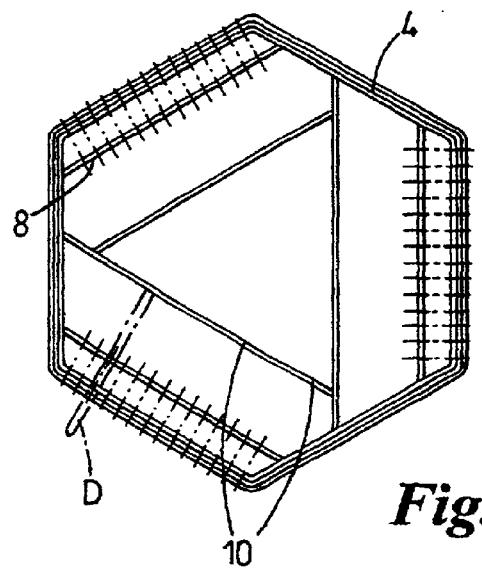
Figure 3:
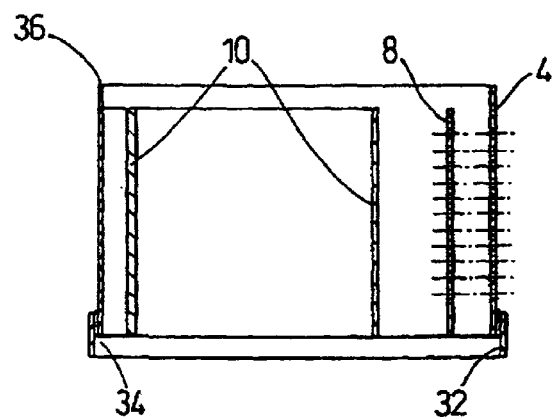
Figure 4:
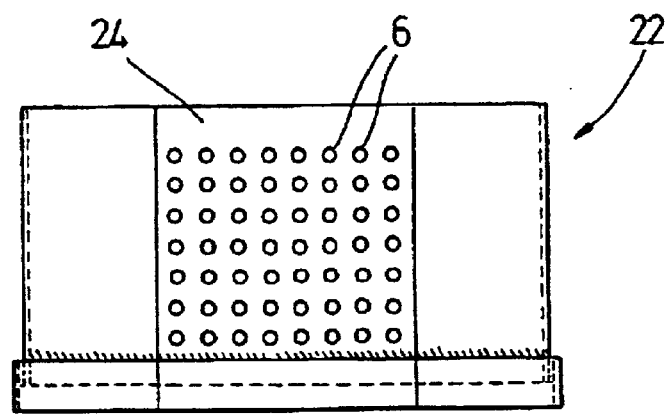
Figure 5:
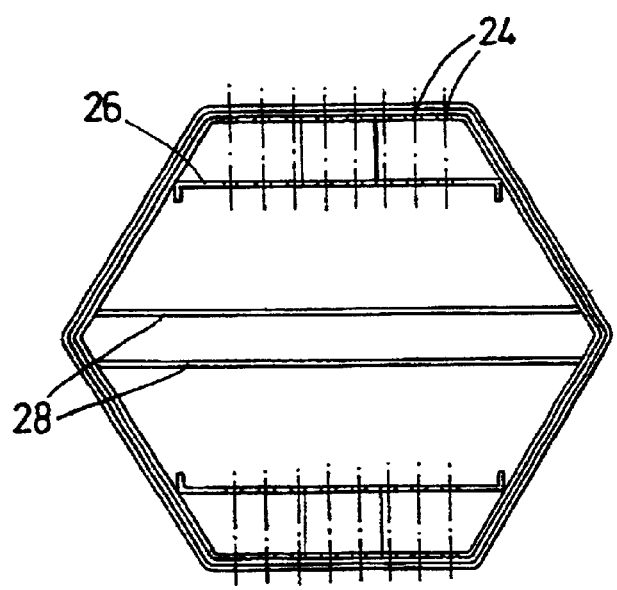
Figure 6:
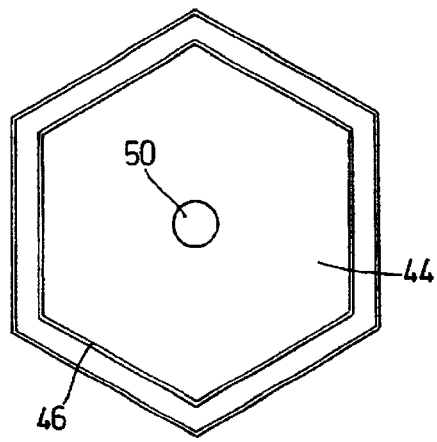
Figure 8:
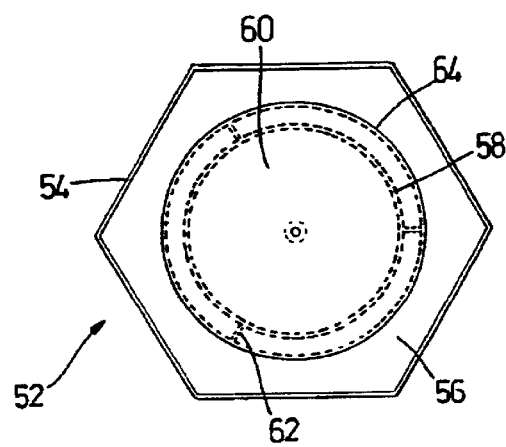
Figure 7:
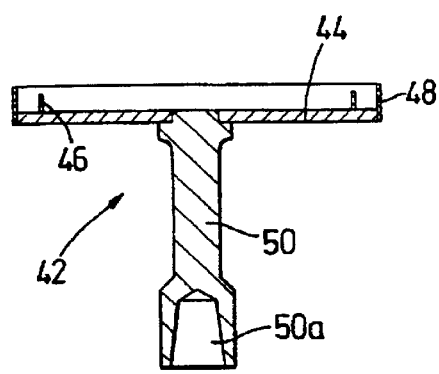
Figure 9:
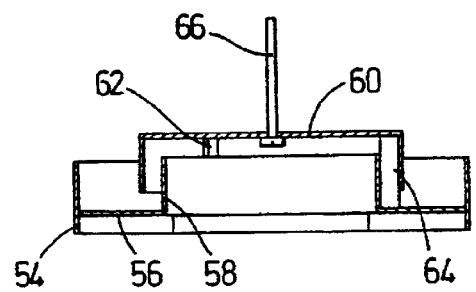
Figure 10:
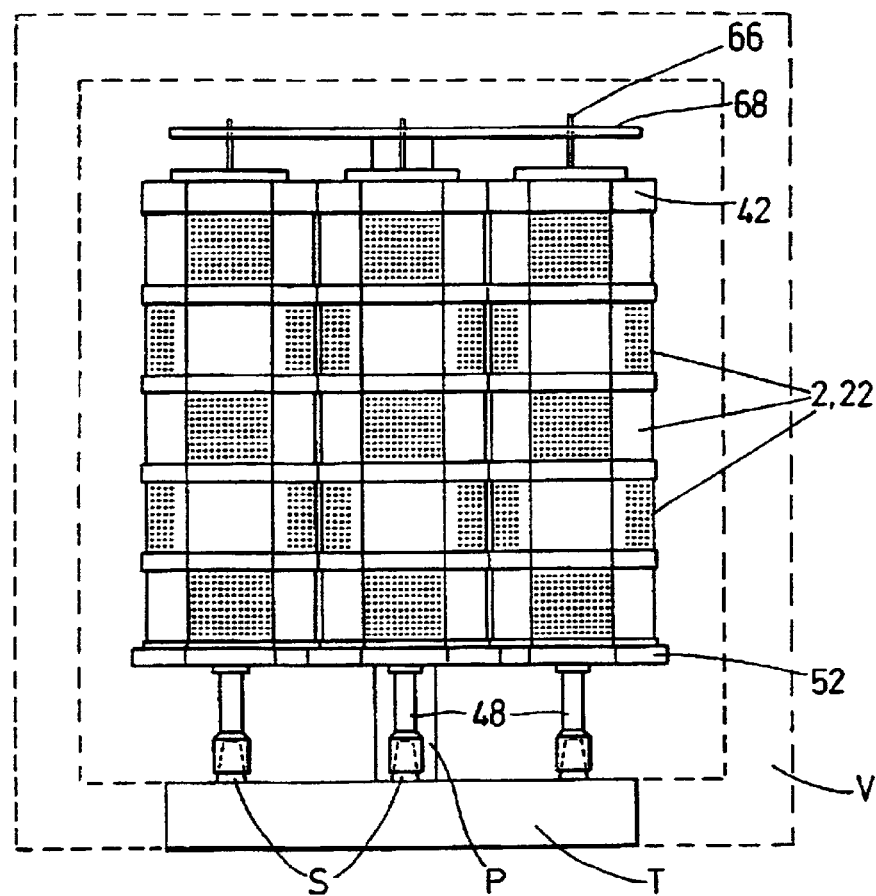

The invention will be described by way of example with reference to the accompanying drawings, in which:

FIGS. 1 to 3 are side, and transverse sectional plan views respectively of a first form of holder according to the invention, FIGS. 4 and 5 are side and plan views of another form of holder according to the invention, FIGS. 6 and 7 are plan and transverse sectional views of a mounting for the holder of FIGS. 1 to 3, FIGS. 8 and 9 are plan and transverse sectional views of a lid for the holder of FIGS. 1 to 3, and FIGS. 10 and 11 are side and plan views illustrating a series of holders of the form shown in FIGS. 1 to 3 assembled in the form of towers and mounted on a PVD chamber turntable, the chamber being indicated schematically in FIG. 10.

The holders shown in the drawings are designed to permit the tips of fluted high speed steel drills to be given a titanium nitride coating by PVD over about one quarter of the fluted length of the drills. A single drill D is shown in phantom in FIG. 2, to illustrate how each drill is mounted in a holder with its tip projecting to be exposed to the coating vapour, the remainder of the drill shank being shielded by the holder.

The holder 2 of FIGS. 1 to 3 has a hexagonal plan form and alternate outer side walls 4 are drilled with a rectangular array of apertures 6 over their walls and most of their height to receive a bank of drills. The apertures are spaced to leave clearances between adjacent drills approximately equal to their diameter. Behind each perforated outer wall and parallel to it an inner wall 8 extends across the holder. Each inner wall has a corresponding array of apertures (not shown) so that the inserted drills D are held parallel to each other. The apertures of the inner wall are set slightly below those in the outer wall so that the drills can rest stably, inclined at an angle of about 2° from the horizontal. The depth of insertion of the drills is limited by back walls 10 which present planar abutment faces parallel to each outer wall, over the area of each array of apertures. The back walls are connected to each other to give a stable sub-assembly which is attached to the outer walls only at three positions around the inner periphery of the outer walls 4.

The drills fit freely in the apertures 6 to allow them to be inserted and removed easily, but the clearance must be limited to minimise the spread of the coating material beyond the exposed tips. It is therefore required to provide different holders for different diameters of drill if a range of diameters are to be treated. The number of apertures in each array will be reduced and their spacing increased as the drill size increases, and the depth of insertion must also be increased if the same proportion of the drill length is to be exposed. Beyond a certain size of drill, therefore, other changes are required.

FIGS. 4 and 5 show a holder 22 of the same size and hexagonal plan form as that in the first example, but because it is intended for drills of significantly greater length and diameter, apertured outer walls 24 are provided only on one pair of diametrically opposite sides of the hexagon. In the same manner as the holder of FIGS. 1 to 3, the drills are held in corresponding arrays of apertures 6 in the outer walls 24 and inner walls 26 and their depth of insertion is limited by the parallel back walls 28. The inner and back walls are thus provided only on those two opposite sides.

Figure 11:
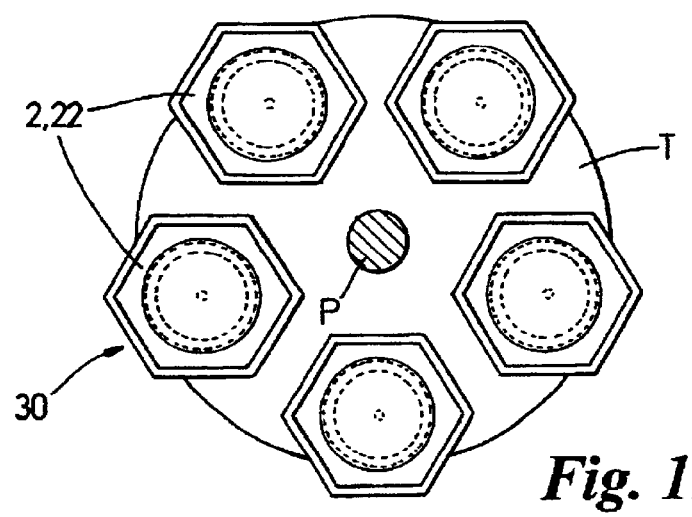

The holders 2,22 of FIGS. 1 to 5 are designed to be stacked to form a tower 30, as shown in FIGS. 10 and 11, in order to utilize the height of the PVD chamber. Each holder has a bottom skirt 32 stepped out from the outer side walls 4,24 so that one holder can be placed upon another, with a shoulder 34 at the inner face of the skirt resting on the top edge 36 of the outer wall of the lower holder, and the skirt 32 helping to block the ingress of the coating material into the tower. A base unit 42 for the tower, as shown in FIGS. 6 and 7, has a platform 44 in which the bottom flange 32 of the lowermost holder is received, located around inner peripheral wall 46 and within outer peripheral wall 48, the walls 46,48 also helping to block any ingress of coating material. The base unit has a central spigot 50 extending below the platform, provided with a socket 50a to allow the tower to be mounted on a rotary spindle as will be further described below.

The interior of the tower is closed by a lid 52, shown in FIGS. 8 and 9, placed on the topmost holder 2,22. The lid has an outer peripheral wall 54 which overlaps the holder outer walls 4 and from which a ring-form first cover plate 56 projects inwards, the lid resting on the holder top edge 36 by the cover plate 56. At its inner periphery, a cylindrical collar 58 projects upwards from the cover plate 56. A disc-form inner cover plate 60 is secured coaxially over the collar 58 by three spacer ribs 62. The inner cover plate 60 has a dependent collar 64 which is spaced from but overlaps the first collar 58 vertically. A locating stem 66 projects from the inner cover plate. The arrangement of outer and inner cover plates 56,62 shields the interior of the tower completely from above but the space between the collars 58,64 provides a gas path to and from the interior.

The two forms of holders 2,22 described so far are employed in a similar manner in a known form of vapour deposition vacuum chamber V, indicated only in schematic outline in FIG. 10. On the floor of the chamber is a turntable T which is rotated by a motor drive (not shown) about a central vertical axis in the chamber. A series of vertical spindles S project from the turntable to be rotated by a planetary drive (not shown) in the turntable as it rotates about its central axis.

Five equispaced towers are mounted on the spindles by the socketed spigots 48 of their base plates and they are positively located with their central axes parallel by a top plate 68 (shown in FIG. 10 only) which is positioned on a central pillar P of the turntable and on the locating stems 66 after the towers have been built up, engaging those stems in a manner which permits them to rotate freely. During the vapour deposition process, which is typically performed at a temperature of 500° C. under high vacuum, the towers are rotated continuously with the turntable. Each tower is also rotated by the drives to the spindles on which they are mounted, so that each bank of drills is intermittently exposed to the plasma zones in the outer peripheral region of the chamber to assist the evenness and spread of coating of the exposed tips.

When the coating process has been completed nitrogen is introduced into the chamber to reduce the vacuum and assist cooling. The gas path between the spaced collars 58,64 of the lids allows a convection flow through the interior of each tower so that the drill shanks are also cooled, the flow permeating the full height of the tower from the gaps at the drill flute recesses in the hollow walls. The convection flow through the vented lid gives a more uniform cooling so that the process cycle time can thus be reduce, without risk of oxidation on the surface of the drill shanks when they are exposed to the surrounding air.

Although the preceding description has referred to coating only a small part of the length of the drills at their tips, it should be understood that holders of the form shown can be employed to give fluted drills a PVD coating over most or all of their fluted length, with a suitable modification of the spacings of the supporting walls of the holders.

What is claimed is:

1. A holder for supporting a series of drills in a vapor deposition chamber to allow a ceramic coating to be deposited on regions of the drills extending from tips of the drills, the holder comprising:
    at least one perforated outer wall provided with an array of apertures into which the drills can be inserted from an exterior of the holder, the drills are being inserted with said regions projecting outwards from the holder,
    a support wall within a hollow interior of the holder for the or each perforated outer wall, said support wall being parallel with and spaced from the outer wall and provided with a corresponding array of apertures for locating the inserted drills with shanks thereof substantially parallel,
    stop means within the hollow interior of the holder spaced inwardly of the or each support wall for locating the tips of drills of the same diameter projecting to substantially the same extent from the outer wall, and
    a gas passage separate from said apertures for permitting gas flow between the interior and exterior of the holder,
    wherein the hollow interior of the holder and the locating of the drills is such that the part of each drill inwards of the outer wall is shielded from the exterior but is exposed to atmosphere within the hollow interior of the holder.

2. A holder according to claim 1 wherein the stop means comprise a back wall in the interior of the holder, parallel to said outer wall and to said support wall.

3. A holder according to claim 1 having a polygonal outer periphery, said at least one outer wall forming at least one face of said periphery.

4. A holder according to claim 3 and having a hexagonal outer periphery, alternate walls of the holder being perforated with an array of apertures into which the drills can be inserted.

5. A holder according to claim 1 provided with a lid shielding the hollow interior from above, said lid being provided with the gas passage.

6. A holder according to claim 1 provided with means for stacking of the holder with a second holder having a corresponding outer wall configuration.

7. A holder according to claim 6 having top and bottom faces for abutment together whereby the two corresponding holders can be supported one on the other, and a flange projecting over said abutment of the faces for providing a closure for the joint between the abutting faces.

8. A method of vapor-deposition coating the tips of a series of drills in which the drills are inserted in a hollow holder having a polygonal plan form with the tips to be coated projecting from at least one outer face of said polygonal form, the holder with the inserted tips being rotated in a vapor deposition chamber to allow each of the drill tips to project from the holder towards the periphery of the chamber for at least a part of the processing period, and a gas admitted to the chamber after deposition of the coating being allowed to circulate through the hollow interior of the holder.

\* \* \* \* \*